(12) United States Patent
Kim et al.

(10) Patent No.: US 9,583,491 B2
(45) Date of Patent: Feb. 28, 2017

(54) CMOS NANOWIRE STRUCTURE

(71) Applicants:Seiyon Kim, Portland, OR (US); Kelin J. Kuhn, Aloha, OR (US); Tahir Ghani, Portland, OR (US); Anand S. Murthy, Portland, OR (US); Annalisa Cappellani, Portland, OR (US); Stephen M. Cea, Hillsboro, OR (US); Rafael Rios, Portland, OR (US); Glenn A. Glass, Beaverton, OR (US)

(72) Inventors: Seiyon Kim, Portland, OR (US); Kelin J. Kuhn, Aloha, OR (US); Tahir Ghani, Portland, OR (US); Anand S. Murthy, Portland, OR (US); Annalisa Cappellani, Portland, OR (US); Stephen M. Cea, Hillsboro, OR (US); Rafael Rios, Portland, OR (US); Glenn A. Glass, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/948,083

(22) Filed: Nov. 20, 2015

(65) Prior Publication Data

US 2016/0086951 A1 Mar. 24, 2016

Related U.S. Application Data

(63) Continuation of application No. 13/996,503, filed as application No. PCT/US2011/067225 on Dec. 23, 2011, now Pat. No. 9,224,810.

(51) Int. Cl.
*H01L 27/092* (2006.01)
*H01L 21/8238* (2006.01)
(Continued)

(52) U.S. Cl.
CPC .......... *H01L 27/0924* (2013.01); *B82Y 10/00* (2013.01); *H01L 21/8238* (2013.01);
(Continued)

(58) Field of Classification Search
None
See application file for complete search history.

(56) References Cited

U.S. PATENT DOCUMENTS 7,354,831 B2 4/2008 Orlowski
7,479,421 B2 1/2009 Kavalieros et al.
(Continued)

FOREIGN PATENT DOCUMENTS

JP 2010-272859 12/2010
KR 10-2005-0033200 10/2006
(Continued)

OTHER PUBLICATIONS

International Search Report and Written Opinion for PCT Patent Application No. PCT/US2011/067225 Mailed Sep. 24, 2012, 9 Pages.
(Continued)

*Primary Examiner* — Angel Roman
*Assistant Examiner* — Kevin Quinto
(74) *Attorney, Agent, or Firm* — Blakely, Sokoloff, Taylor & Zafman LLP

(57) ABSTRACT

Complimentary metal-oxide-semiconductor nanowire structures are described. For example, a semiconductor structure includes a first semiconductor device. The first semiconductor device includes a first nanowire disposed above a substrate. The first nanowire has a mid-point a first distance above the substrate and includes a discrete channel region and source and drain regions on either side of the discrete channel region. A first gate electrode stack completely surrounds the discrete channel region of the first nanowire.

(Continued)

The semiconductor structure also includes a second semiconductor device. The second semiconductor device includes a second nanowire disposed above the substrate. The second nanowire has a mid-point a second distance above the substrate and includes a discrete channel region and source and drain regions on either side of the discrete channel region. The first distance is different from the second distance. A second gate electrode stack completely surrounds the discrete channel region of the second nanowire.

15 Claims, 10 Drawing Sheets

(51) Int. Cl.

| | | |
|---|---|---|
| *H01L 27/12* | (2006.01) | |
| *H01L 29/06* | (2006.01) | |
| *B82Y 10/00* | (2011.01) | |
| *H01L 29/66* | (2006.01) | |
| *H01L 29/775* | (2006.01) | |
| *H01L 21/84* | (2006.01) | |
| *H01L 29/423* | (2006.01) | |
| *H01L 29/10* | (2006.01) | |

(52) U.S. Cl.
CPC ........... *H01L 21/823807* (2013.01); *H01L 21/823821* (2013.01); *H01L 21/823828* (2013.01); *H01L 21/84* (2013.01); *H01L 27/092* (2013.01); *H01L 27/12* (2013.01); *H01L 27/1203* (2013.01); *H01L 29/0673* (2013.01); *H01L 29/0676* (2013.01); *H01L 29/1033* (2013.01); *H01L 29/42356* (2013.01); *H01L 29/42392* (2013.01); *H01L 29/66439* (2013.01); *H01L 29/775* (2013.01)

(56) References Cited

U.S. PATENT DOCUMENTS

| | | | |
|---|---|---|---|
| 2004/0112964 A1* | 6/2004 | Empedocles | B82Y 10/00 235/491 |
| 2006/0240622 A1 | 10/2006 | Lee et al. | |
| 2007/0017439 A1 | 1/2007 | Xianyu et al. | |
| 2007/0231976 A1 | 10/2007 | Kang et al. | |
| 2008/0121932 A1* | 5/2008 | Ranade | H01L 21/28255 257/192 |
| 2010/0295021 A1 | 11/2010 | Chang et al. | |
| 2010/0297816 A1 | 11/2010 | Bedell et al. | |
| 2011/0031473 A1 | 2/2011 | Chang et al. | |
| 2011/0233522 A1 | 9/2011 | Cohen et al. | |
| 2011/0278544 A1* | 11/2011 | Bangsaruntip | B82Y 10/00 257/24 |
| 2011/0303972 A1 | 12/2011 | Saitoh | |
| 2012/0138886 A1 | 6/2012 | Kuhn et al. | |
| 2014/0209855 A1 | 7/2014 | Cea et al. | |

FOREIGN PATENT DOCUMENTS

| | | |
|---|---|---|
| TW | 201123429 | 7/2011 |
| WO | WO-2008034850 | 3/2008 |
| WO | WO-2010/094360 | 8/2010 |

OTHER PUBLICATIONS

Non-Final Office Action from U.S. Appl. No. 13/996,503 mailed Jun. 20, 2014, 23 pgs.
International Preliminary Report on Patentability from PCT/US2011/067225 mailed Jul. 3, 2014, 6 pgs.
Office Action from Taiwan Patent Application No. 101148662 mailed Oct. 23, 2014, 7 pgs.
Orlowski, Marius et al., "Si, SiGe, Ge, and III-V Semiconductor Nanomembranes and Nanowires Enabled by SiGe Epitaxy," The Electrochemical Society, ECS Transactions, 33 (6) pp. 777-789 (2010).
Office Action from Taiwan Patent Application No. 101148662 mailed May 25, 2015, 9 pgs.
Search Report from Taiwan Patent Application 101148662 mailed Oct. 7, 2014, 1 pg.
Final Office Action from U.S. Appl. No. 13/996,503 mailed Mar. 16, 2015, 12 pgs.
Final Office Action from U.S. Appl. No. 13/996,503 mailed Jun. 18, 2015, 9 pgs.
Office Action from Chinese Patent Application No. 201180075765.6 mailed Mar. 2, 2016, 15 pages.

* cited by examiner

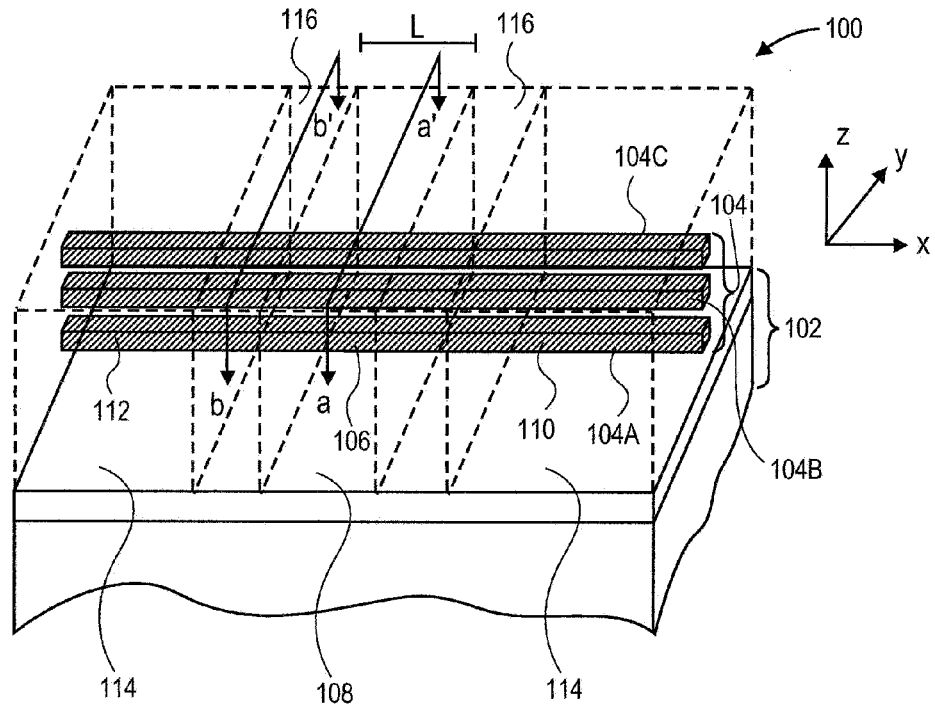
FIG. 1A
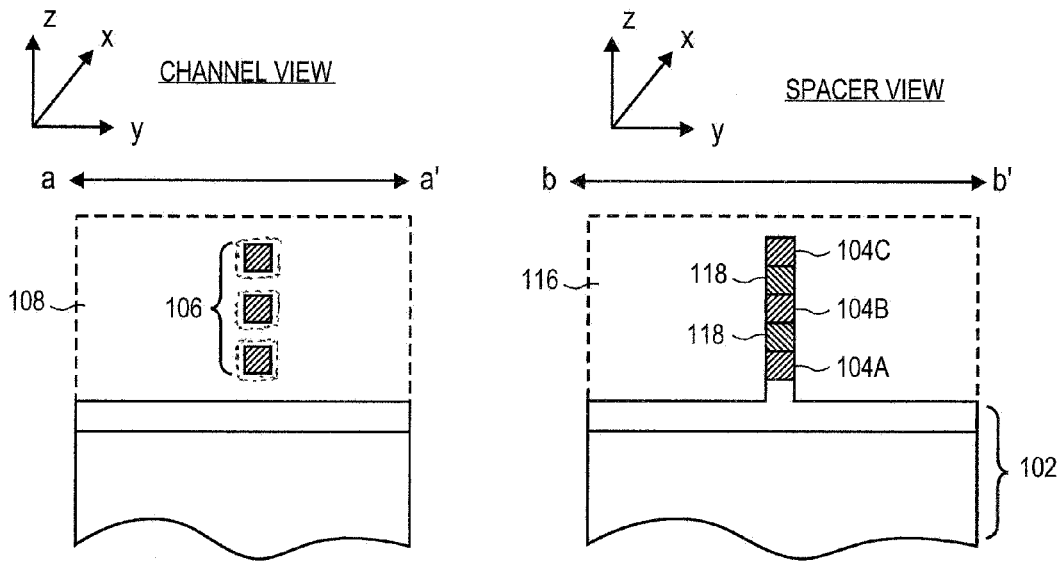
FIG. 1B  FIG. 1C

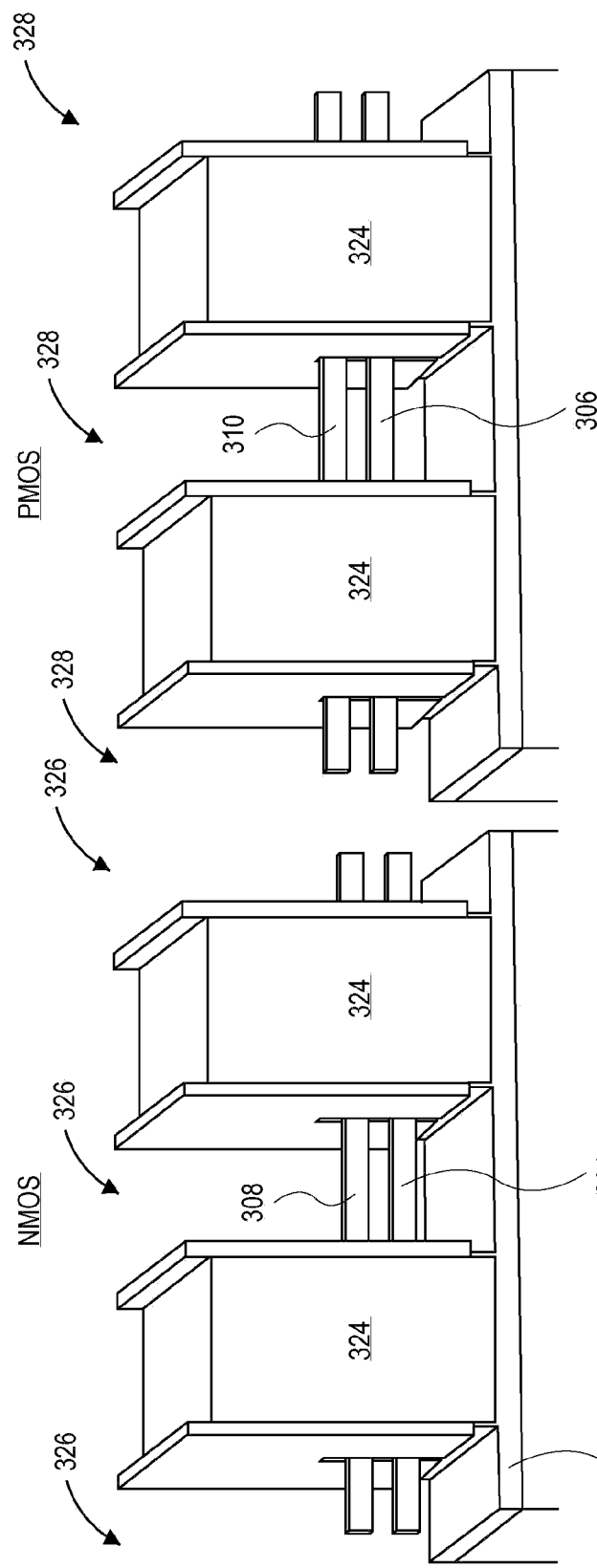

US 9,583,491 B2

CMOS NANOWIRE STRUCTURE

CROSS-REFERENCE TO RELATED APPLICATIONS

This application is a continuation of U.S. patent application Ser. No. 13/996,503, filed on Jun. 20, 2013, which is a U.S. National Phase Application under 35 U.S.C. §371 of International Application No. PCT/US2011/067225, filed on Dec. 23, 2011, the entire contents of which are hereby incorporated by reference herein.

TECHNICAL FIELD

Embodiments of the invention are in the field of nanowire semiconductor devices and, in particular, complimentary metal-oxide-semiconductor (CMOS) nanowire structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example.

Many different techniques have been attempted to improve the mobility of transistors. However, significant improvements are still needed in the area of electron and/or hole mobility improvement for semiconductor devices.

SUMMARY

Embodiments of the present invention include complimentary metal-oxide-semiconductor (CMOS) nanowire structures.

In an embodiment, a semiconductor structure includes a first semiconductor device. The first semiconductor device includes a first nanowire disposed above a substrate. The first nanowire has a mid-point a first distance above the substrate and includes a discrete channel region and source and drain regions on either side of the discrete channel region. A first gate electrode stack completely surrounds the discrete channel region of the first nanowire. The semiconductor structure also includes a second semiconductor device. The second semiconductor device includes a second nanowire disposed above the substrate. The second nanowire has a mid-point a second distance above the substrate and includes a discrete channel region and source and drain regions on either side of the discrete channel region. The first distance is different from the second distance. A second gate electrode stack completely surrounds the discrete channel region of the second nanowire.

In another embodiment, a semiconductor structure includes a first semiconductor device. The first semiconductor device includes a first nanowire disposed above a substrate. The first nanowire has a discrete channel region and source and drain regions on either side of the discrete channel region. The discrete channel region is composed of a semiconductor backbone material. A first gate electrode stack completely surrounds the discrete channel region of the first nanowire. The semiconductor structure also includes a second semiconductor device. The second semiconductor device includes a second nanowire disposed above the substrate. The second nanowire has a discrete channel region and source and drain regions on either side of the discrete channel region. The discrete channel region is composed of the semiconductor backbone material as well as a surrounding cladding material layer not included in the channel region of the first semiconductor device. A second gate electrode stack completely surrounds the discrete channel region of the second nanowire.

In another embodiment, a method of fabricating a CMOS nanowire semiconductor structure includes forming a first active layer above a substrate, the first active layer having a first lattice constant. A second active layer is formed on the first active layer, the second active layer having a second lattice constant greater than the first lattice constant. A first nanowire is formed from the first active layer. The first nanowire includes a discrete channel region and source and drain regions on either side of the discrete channel region. A second nanowire is formed from the second active layer. The second nanowire includes a discrete channel region and source and drain regions on either side of the discrete channel region. A first gate electrode stack is formed to completely surround the discrete channel region of the first nanowire. A second gate electrode stack is formed to completely surround the discrete channel region of the second nanowire.

BRIEF DESCRIPTION OF THE DRAWINGS

FIG. 1A illustrates a three-dimensional cross-sectional view of a nanowire-based semiconductor structure, in accordance with an embodiment of the present invention.

FIG. 1B illustrates a cross-sectional channel view of the nanowire-based semiconductor structure of FIG. 1A, as taken along the a-a' axis, in accordance with an embodiment of the present invention.

FIG. 1C illustrates a cross-sectional spacer view of the nanowire-based semiconductor structure of FIG. 1A, as taken along the b-b' axis, in accordance with an embodiment of the present invention.

FIGS. 3A-3F illustrate three-dimensional cross-sectional views representing various operations in a method of fabricating a CMOS nanowire semiconductor structure, in accordance with an embodiment of the present invention.

DETAILED DESCRIPTION

Figure 2:
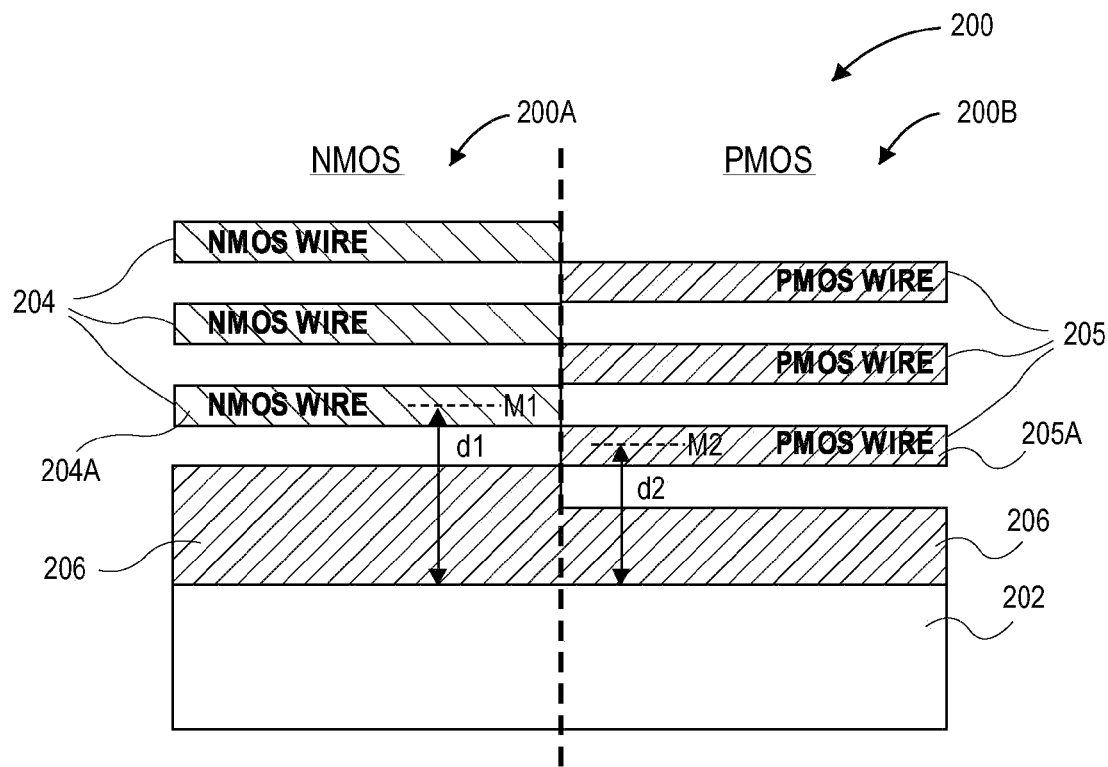
FIG. 2 illustrates a cross-sectional view of a CMOS nanowire-based semiconductor structure, in accordance with an embodiment of the present invention.

Complimentary metal-oxide-semiconductor (CMOS) nanowire structures are described. In the following description, numerous specific details are set forth, such as specific nanowire integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to integrated gate-all-around nanowire CMOS structures utilizing independent channel materials for NMOS and PMOS. High performance, low leakage CMOS transistor technology approaches are described herein. In an example, different channel materials are utilized for NMOS/PMOS starting from one common multi-layer epi stack. In another example, independently optimized channel materials may provide for higher electron and hole mobility channel formation by growing cladding epi layer on backbone wires.

Difficulty in increasing electron and hole mobility simultaneously when the same channel material is used for both the NMOS and PMOS is addressed herein. Device performance may be enhanced using strain solutions, higher mobility channel materials, or higher mobility channel orientations. For example, embedded SiGe (e-SiGe), embedded Si—C(e-SiC), stress memorization, contact etch stop layers (CESL) are current strain solutions. SiGe, Ge and III-V, different orientations, and various strained Si on SiGe (or reversed) have also been investigated.

In an embodiment, instead of growing epitaxial films separately for NMOS and PMOS or incorporating separate embedded strain layer, a multiple epitaxial layer structure (superlattice) is fabricated and subsequently disassembled using a first portion for NMOS and a second portion for PMOS nanowire devices. Growing thick strained layers is difficult due to strain relaxation issues, particularly as the fin geometries get taller. Strain relaxation may cause excessive defects in the epi layer and degrade device performance, yield, and reliability. While using a superlattice (for example Si/SiGe) is a known to the problem of making well controlled strained layers of different materials, in an embodiment, a superlattice is first fabricated and subsequently partitioned to maximize mobility for NMOS or PMOS, respectively.

Nanowire/nanoribbon structure may be formed by selective etching of sacrificial layers from multilayer epitaxial stacks. The epitaxial layers may be used as a channel or may be selectively removed to form a gap for all-around gate structure. The isolation layer under epitaxial wires may provide electrical isolation and form a bottom gap for all-around gate. The simplest CMOS integration scheme employs N/P MOS channels fabricated with the same material. The process is simpler to fabricate in that it employs a single selective etch. However, strain technology may be required to boost device performance. For example, when silicon was used for channel material, PMOS is enhanced by compressive stress and NMOS is enhanced by a tensile stress along channel direction to enhance carrier mobility.

In accordance with an embodiment of the present invention, the unique features of a starting material stack are exploited to integrate different NMOS and PMOS channel materials which are optimized for higher mobility. For example, in one embodiment, a sacrificial layer of an NMOS device is used as a PMOS channel and a sacrificial layer of a PMOS device is used as an NMOS channel. Since the sacrificial layer may be removed during processing, independent choice of channel materials and optimization is made possible.

One or more embodiments of the present invention are directed at improving the channel mobility for NMOS or PMOS transistors, or both. Mobility may be improved using strain, e.g., in the channel region. Thus, one or more approaches described herein provide the appropriate strain in the channel regions for both NMOS and PMOS transistors. In an embodiment, strained NMOS and PMOS nanowires are provided.

In a first aspect, FIG. 1A illustrates a three-dimensional cross-sectional view of a nanowire-based semiconductor structure, in accordance with an embodiment of the present invention. FIG. 1B illustrates a cross-sectional channel view of the nanowire-based semiconductor structure of FIG. 1A, as taken along the a-a' axis. FIG. 1C illustrates a cross-sectional spacer view of the nanowire-based semiconductor structure of FIG. 1A, as taken along the b-b' axis.

Referring to FIG. 1A, a semiconductor device 100 includes one or more vertically stacked nanowires (104 set) disposed above a substrate 102. Embodiments herein are targeted at both single wire devices and multiple wire devices. As an example, a three nanowire-based devices having nanowires 104A, 104B and 104C is shown for illustrative purposes. For convenience of description, nanowire 104A is used as an example where description is focused on only one of the nanowires. It is to be understood that where attributes of one nanowire are described, embodiments based on a plurality of nanowires may have the same attributes for each of the nanowires.

Each of the nanowires 104 includes a channel region 106 disposed in the nanowire. The channel region 106 has a length (L). Referring to FIG. 1B, the channel region also has a perimeter orthogonal to the length (L). Referring to both FIGS. 1A and 1B, a gate electrode stack 108 surrounds the entire perimeter of each of the channel regions 106. The gate electrode stack 108 includes a gate electrode along with a gate dielectric layer disposed between the channel region 106 and the gate electrode (shown as the dashed lines surrounding the channel regions 106 in FIG. 1B). The channel region 106 is discrete in that it is completely surrounded by the gate electrode stack 108. That is, where the gate electrode stack 108 surrounds the channel region 106, any intervening material such as underlying substrate material or overlying channel fabrication materials have been removed. Accordingly, in embodiments having a plurality of nanowires 104, the channel regions 106 of the nanowires are also discrete relative to one another, as depicted in FIG. 1B.

Referring again to FIG. 1A, each of the nanowires 104 also includes source and drain regions 110 and 112 disposed in the nanowire on either side of the channel region 104. A pair of contacts 114 is disposed over the source/drain regions 110/112. In a specific embodiment, the pair of contacts 114 surrounds the entire perimeter of each of the source/drain regions 110/112, as depicted in FIG. 1A. That is, in an embodiment, the source/drain regions 110/112 are discrete in that they are completely surrounded by the contacts 114 without any intervening material such as underlying substrate material or overlying channel fabrication materials. Accordingly, in such an embodiment having a plurality of nanowires 104, the source/drain regions 110/112 of the nanowires are also discrete relative to one another.

Referring again to FIG. 1A, in an embodiment, the semiconductor device 100 further includes a pair of spacers 116. The spacers 116 are disposed between the gate electrode stack 108 and the pair of contacts 114. As described above, the channel regions and the source/drain regions are, in at least several embodiments, made to be discrete. However, not all regions of the nanowires 104 need be discrete. For example, referring to FIG. 1C, nanowires 104A-104C are not discrete at the location under spacers 116. In one embodiment, the stack of nanowires 104A-104C have intervening semiconductor material 118 there between, such as silicon germanium intervening between silicon nanowires, or vice versa, as described below in association with FIGS. 3A-3F. In one embodiment, the bottom nanowire 104A is still in contact with a portion of substrate 102, e.g., in contact with an insulating layer portion disposed on a bulk substrate. Thus, in an embodiment, a portion of the plurality of vertically stacked nanowires under one or both of the spacers is non-discrete.

Although the device 100 described above is for a single device, e.g., an NMOS or a PMOS device, a CMOS architecture may also be formed to include both NMOS and PMOS nanowire-based devices disposed on or above the same substrate. For example, FIG. 2 illustrates a cross-sectional view of a nanowire-based CMOS semiconductor structure, in accordance with an embodiment of the present invention.

Referring to FIG. 2, a semiconductor structure 200 includes a first semiconductor device 200A. The first semiconductor device 200A includes a first nanowire (e.g., bottommost nanowire 204A of nanowire stack 204) disposed above a substrate 202. The first nanowire 204A has a mid-point (M1) a first distance (d1) above the substrate 202. A first gate electrode stack (not shown) can be formed to completely surround the first nanowire 204A. That is, once the gate stack is included, first nanowire 204A has a discrete channel region and source and drain regions on either side of the discrete channel region.

The semiconductor structure 200 also includes a second semiconductor device 200B. The second semiconductor device 200B includes a second nanowire (e.g., bottommost nanowire 205A of nanowire stack 205) disposed above the substrate 202. The second nanowire 205A has a mid-point (M2) a second distance (d2) above the substrate 202. A second gate electrode stack (not shown) can be formed to completely surround the second nanowire 205A. That is, once the second gate stack is included, second nanowire 205A has a discrete channel region and source and drain regions on either side of the discrete channel region.

Referring again to FIG. 2, the first distance (d1) is different from the second distance (d2). That is, the mid-points M1 and M2 of the devices 200A and 200B are not aligned. Instead, in an embodiment, the midpoints are staggered and, when stacks of a plurality of wires (e.g., 204 and 205) are formed, the wires for each device 200A and 200B are staggered relative to one another. It is to be understood that the dashed line in FIG. 2 can represent a relatively small or quite large spacing distance of devices 200A and 200B on a common substrate 202. In an embodiment, an isolation layer 206, such as an oxide layer, isolates the nanowires 204 and 205 from the substrate 202, as depicted in FIG. 2.

In an embodiment, the first nanowire is composed of a material such as, but not limited to, silicon, strained silicon, silicon germanium ($Si_xGe_y$, where $0<x<100$, and $0<y<100$), silicon carbide, carbon doped silicon germanium or a group III-V compound, and the second nanowire is composed of a different material such as, but not limited to, silicon, strained silicon, silicon germanium ($Si_xGe_y$, where $0<x<100$, and $0<y<100$), carbon doped silicon germanium or a group III-V compound. In one such embodiment, the first semiconductor device is an NMOS device, and the second semiconductor device is a PMOS device. In an embodiment, any suitable combination of the listed materials can be utilized by considering mobility benefit for different carrier types, e.g., electrons or holes.

In an embodiment, the first and second nanowires are disposed above a bulk crystalline substrate having an intervening dielectric layer disposed thereon. The intervening dielectric layer may be fabricated by, e.g., under fin oxidation (UFO), buried oxide formation (BOX), or replacement dielectrics. In an embodiment, the first and second nanowires are disposed above a bulk crystalline substrate having no intervening dielectric layer disposed thereon. In another embodiment, a SiGe/Si buffer layer is used.

In an embodiment, the source and drain regions of each of the first and second nanowires are discrete, the first semiconductor device further includes a first pair of contacts completely surrounding the discrete source and drain regions of the first nanowire, and the second semiconductor device further includes a second pair of contacts completely surrounding the discrete source and drain regions of the second nanowire. In one such embodiment, a first pair of spacers is disposed between the first gate electrode stack and the first pair of contacts, and a second pair of spacers is disposed between the second gate electrode stack and the second pair of contacts. In a specific such embodiment, a portion of each of the first and second nanowires is non-discrete.

In an embodiment, the first semiconductor device further includes one or more additional nanowires vertically stacked with the first nanowire, and the second semiconductor device further includes one or more additional nanowires vertically stacked with the second nanowire. More general embodiments are provided below.

Referring again to FIGS. 1A and 2, the substrate 102 or 202 may be composed of a material suitable for semiconductor device fabrication. In one embodiment, substrate 102 or 202 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is disposed on the lower bulk substrate. Thus, the structure 100 or 200 may be fabricated from a starting semiconductor-on-insulator substrate. As such, in one embodiment, the plurality of vertically stacked nanowires 104, 204 or 205 is disposed above a bulk crystalline substrate having an intervening dielectric layer disposed thereon, as depicted in FIGS. 1A-1C and 2. Alternatively, the structure 100 or 200 is formed directly from a bulk substrate and local oxidation is used to form electrically insulative portions in place of the above described upper insulator layer. As such, in another embodiment, the plurality of vertically stacked nanowires 104, 204 or 205 is disposed above a bulk crystalline substrate having no intervening dielectric layer disposed thereon.

In an embodiment, the nanowires 104, 204 or 205 may be sized as wires or ribbons (the latter described below), and may have squared-off or rounded corners. In an embodiment, the nanowires 104, 204 or 205 are composed of a material such as, but not limited to, silicon, germanium, or a combination thereof. In one such embodiment, the nanowires are single-crystalline. For example, for a silicon nanowire, a single-crystalline nanowire may be based from a (100) global orientation, e.g., with a <100> plane in the z-direction. In an embodiment, the dimensions of the nanowires 104, 204 or 205, from a cross-sectional perspective as shown in FIG. 1B, are on the nano-scale. For example, in a specific embodiment, the smallest dimension of the nanowires is less than approximately 20 nanometers. In accordance with an embodiment of the present invention, the one or more nanowires 104, 204 or 205 of the semiconductor device 100 or structure 200 include one or more uniaxially strained nanowires. The uniaxially strained nanowire or plurality of nanowires may be uniaxially strained with tensile strain or with compressive strain, e.g., for NMOS or PMOS, respectively.

The width and height of each of the channel regions 106 is shown as approximately the same in FIG. 1B, however, they need not be. For example, in another embodiment (not shown), the width of the nanowires 104 (or 204 or 205) is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 104 (or 204 or 205) has a width and a height, the width substantially less than the height. In a specific embodiment, the height is approximately 2-10 times greater than the width.

In an embodiment, referring again to FIG. 1A, the gate electrode of gate electrode stack 108 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, the spacers 116 are composed of an insulative dielectric material such as, but not limited to, silicon dioxide, silicon oxy-nitride or silicon nitride. The contacts 114 are, in an embodiment, fabricated from a metal species. The metal species may be a pure metal, such as nickel or cobalt, or may be an alloy such as a metal-metal alloy or a metal-semiconductor alloy (e.g., such as a silicide material). It is to be understood that other conductive materials may be used to form contacts 114.

In another aspect, methods of fabricating a CMOS nanowire semiconductor structure are provided. For example, FIGS. 3A-3F illustrate three-dimensional cross-sectional views representing various operations in a method of fabricating a CMOS nanowire semiconductor structure, in accordance with an embodiment of the present invention.

Figure 3A:
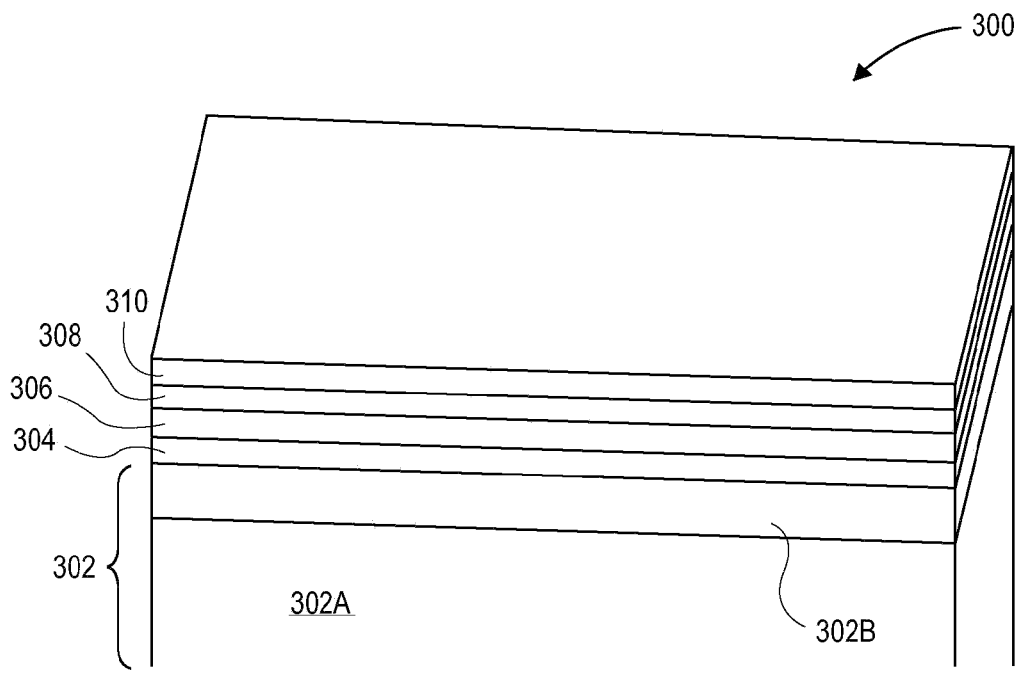

A method of fabricating a nanowire semiconductor structure may, in an embodiment, include forming both a PMOS nanowire-based semiconductor device and an adjacent NMOS nanowire-based semiconductor device. Each device may be fabricated by forming a nanowire above a substrate. In a specific embodiment ultimately providing the formation of two nanowires for each of the NMOS and PMOS nanowire-based semiconductor devices, FIG. 3A illustrates an initial structure 300 having a substrate 302 (e.g., composed of a bulk substrate silicon substrate 302A with an insulating silicon dioxide layer 302B there on) and a silicon layer 304/silicon germanium layer 306/silicon layer 308/silicon germanium layer 310 stack disposed thereon. Other possibilities for materials and specific combinations are provided in association with FIG. 2. In an exemplary embodiment, structure 300 is provided by growing silicon germanium and silicon layers on an initial silicon-on-insulator wafer (the silicon portion of which is layer 304).

Figure 3B:
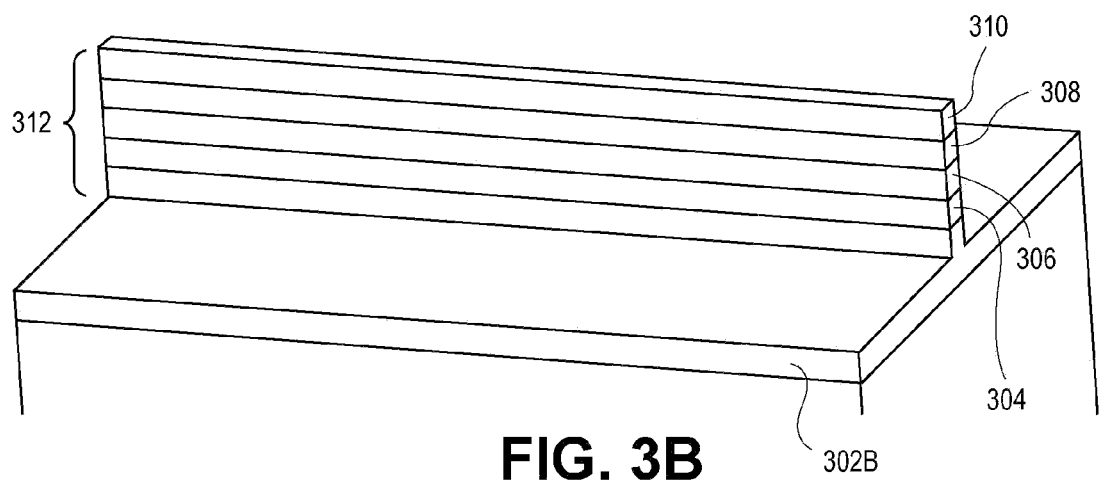

Referring to FIG. 3B, a portion of the silicon layer 304/silicon germanium layer 306/silicon layer 308/silicon germanium layer 310 stack as well as a top portion of the silicon dioxide layer 302B is patterned into a fin-type structure 312, e.g., with a mask and plasma etch process. Thus, in an embodiment, a free surface is formed on either side of each of the silicon and silicon germanium layers by patterning to provide the fin-type structure 312. It is to be understood that any suitable patterning process may be used to form structure 312.

Figure 3C:
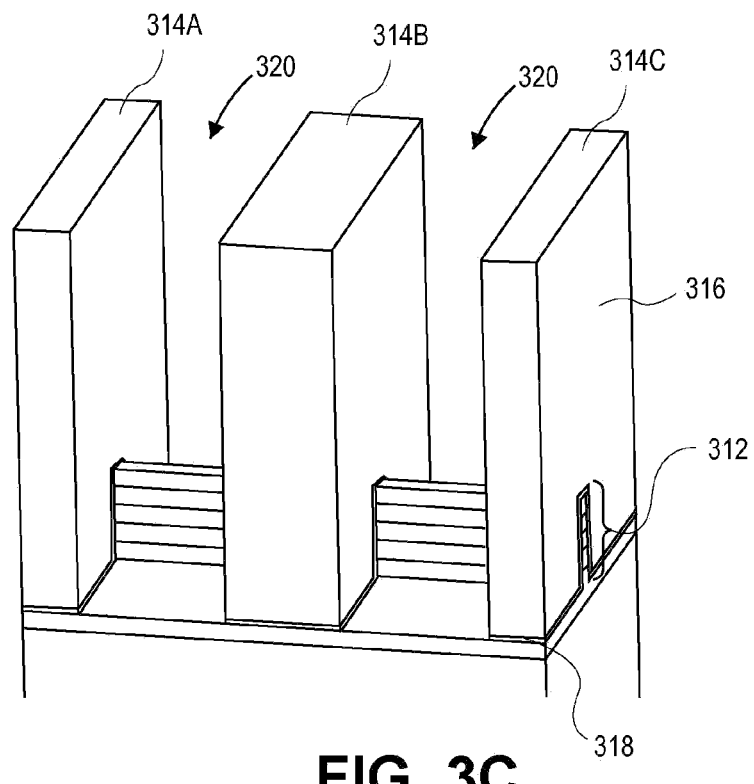

In a specific example showing the formation of three gate structures, FIG. 3C illustrates the fin-type structure 312 with three sacrificial gates 314A, 314B, and 314C disposed thereon. In one such embodiment, the three sacrificial gates 314A, 314B, and 314C are composed of a sacrificial gate oxide layer 316 and a sacrificial polysilicon gate layer 318 which are, e.g., blanket deposited and patterned with a plasma etch process.

Figure 3D:
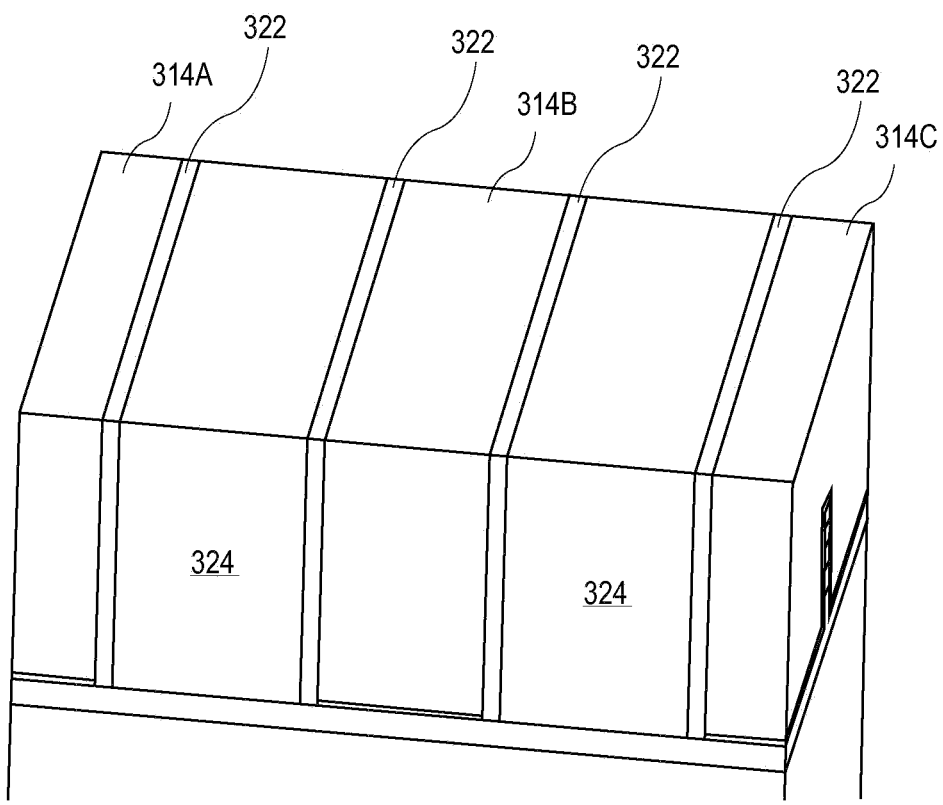

Following patterning to form the three sacrificial gates 314A, 314B, and 314C, spacers may be formed on the sidewalls of the three sacrificial gates 314A, 314B, and 314C, doping may be performed in regions 320 of the fin-type structure 312 shown in FIG. 3C (e.g., tip and/or source and drain type doping), and an interlayer dielectric layer may be formed to cover the three sacrificial gates 314A, 314B, and 314C. The interlayer dielectric layer may then be polished to re-expose the three sacrificial gates 314A, 314B, and 314C for a replacement gate, or gate-last, process. Referring to FIG. 3D, the three sacrificial gates 314A, 314B, and 314C are exposed, along with spacers 322 and interlayer dielectric layer 324.

The sacrificial gates 314A, 314B, and 314C may then be removed, e.g., in a replacement gate or gate-last process flow, to expose channel portions of the fin-type structure 312. Referring to the left-hand portion of FIG. 3E, in the case that the fin-type structure 312 is used to fabricate an NMOS device, the sacrificial gates 314A, 314B, and 314C are removed to provide trenches 326. Portions of the silicon germanium layers 306 and 310 exposed by the trenches 326, as well as exposed portions of the insulating silicon dioxide layer 302B, are removed to leave discrete portions of the silicon layers 304 and 308. Referring to the right-hand portion of FIG. 3E, in the case that the fin-type structure 312 is used to fabricate a PMOS device, the sacrificial gates 314A, 314B, and 314C are removed to provide trenches 328. Portions of the silicon layers 304 and 308 exposed by the trenches 328 are removed to leave discrete portions of the silicon germanium layers 306 and 310.

In an embodiment, the silicon layers 304 and 308 are etched selectively with a wet etch that selectively removes the silicon 304, 308 while not etching the silicon germanium nanowire structures 306 and 310. Such etch chemistries as aqueous hydroxide chemistries, including ammonium hydroxide and potassium hydroxide, for example, may be utilized to selectively etch the silicon. In another embodiment, the silicon germanium layers 306 and 310 are etched selectively with a wet etch that selectively removes the silicon germanium while not etching the silicon nanowire structures 304 and 308. Such etch chemistries as carboxylic acid/nitric acid/HF chemistry, and citric acid/nitric acid/HF, for example, may be utilized to selectively etch the silicon germanium. Thus, either the silicon layers may be removed from the fin-type structure 312 to form silicon germanium nanowires, or the silicon germanium layers may be removed from the fin-type structure 312 to form silicon channel nanowires.

The discrete portions of the silicon layers 304 and 308 (NMOS) or the silicon germanium layers (PMOS) shown in FIG. 3E will, in one embodiment, ultimately become channel regions in a nanowire-based structure. Thus, at the process stage depicted in FIG. 3E, channel engineering or tuning may be performed. For example, in one embodiment, the discrete portions of the silicon layers 304 and 308 shown in the left-hand portion of FIG. 3E, or the discrete portions of the silicon germanium layers 306 and 310 shown in the right-hand portion of FIG. 3E, are thinned using oxidation and etch processes. Such an etch process may be performed at the same time the wires are separated by etching the opposing silicon or silicon germanium layers. Accordingly, the initial wires formed from silicon layers 304 and 308, or from silicon germanium layers 306 and 310, begin thicker and are thinned to a size suitable for a channel region in a nanowire device, independent from the sizing of the source and drain regions of the device.

Figure 3F:
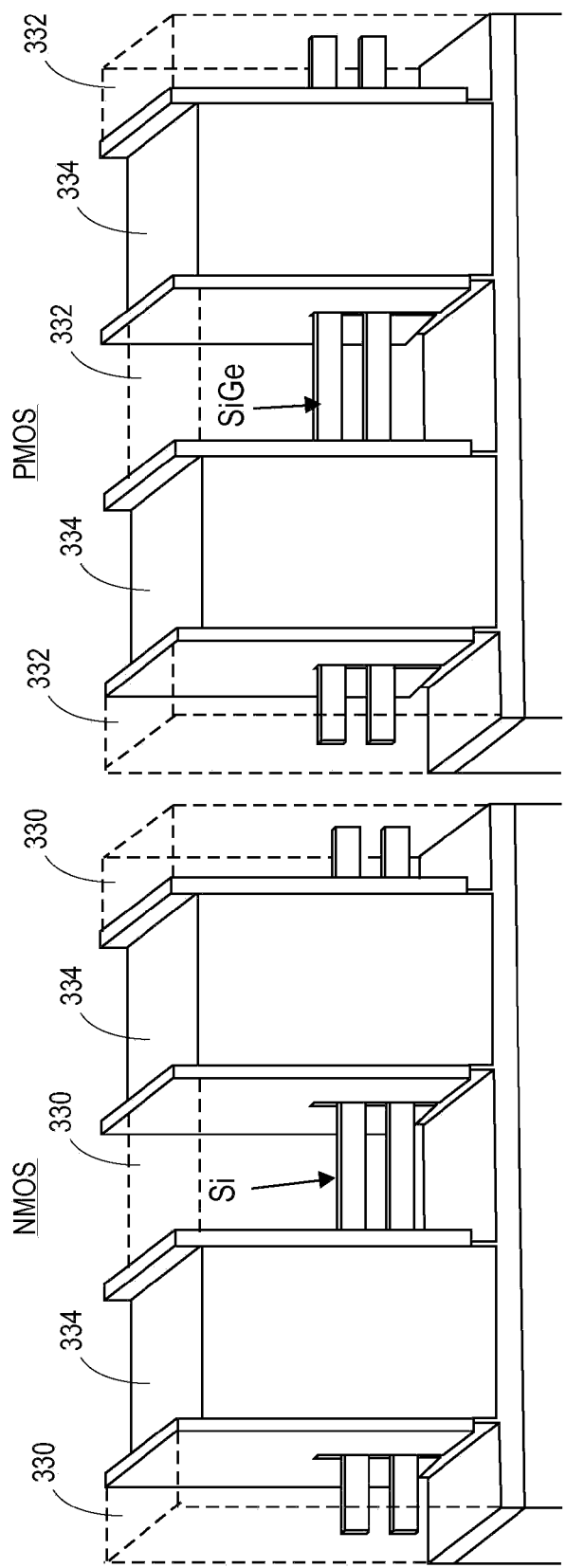

Following formation of the discrete channel regions as depicted in FIG. 3E, high-k gate dielectric and metal gate processing may be performed and source and drain contacts may be added be added. In the specific example showing the formation of three gate structures over two silicon nanowires (NMOS) or over two silicon germanium nanowires (PMOS), FIG. 3F illustrates the structure following deposition of an NMOS gate stack 330 or a PMOS gate stack 332. The gate stacks may be composed of a high-k gate dielectric layer and an N-type or P-type metal gate electrode layer, respectively. Additionally, FIG. 3F depicts the result of the subsequent removal of the interlayer dielectric layer 324 after formation of the permanent gate stack. Contacts may be formed in the place of the interlayer dielectric layer 324 portions remaining in FIG. 3E. In an embodiment, at some stage during the process of removing 324 and forming contacts 334, source and drain engineering may also be performed.

Thus, in perhaps more general terms, in an embodiment, a method of fabricating a nanowire semiconductor structure includes forming a first active layer above a substrate. The first active layer has a first lattice constant. A second active layer is then formed on the first active layer. The second active layer has a second lattice constant greater than the first lattice constant. In one such embodiment, the first active layer is composed of silicon, and the second active layer is composed of silicon germanium ($Si_xGe_y$, where 0<x<100, and 0<y<100). The number of active layers could stop here, e.g., for a CMOS structure with a single wire PMOS device and a single wire NMOS device. Alternatively, as exemplified above, additional first and second active layers may be repeated to ultimately provide multi-wire devices.

In an embodiment, the first active layer is formed above a bulk crystalline substrate having an intervening dielectric layer disposed thereon. The first active layer is formed on the intervening dielectric layer. In one such embodiment, the first active layer is composed of silicon. The method then includes forming a first nanowire from the first active layer. The first nanowire includes a discrete channel region and source and drain regions on either side of the discrete channel region. A second nanowire is formed from the second active layer. The second nanowire includes a discrete channel region and source and drain regions on either side of the discrete channel region. In an embodiment, forming the first nanowire from the first active layer includes selectively removing a portion of the second active layer. Meanwhile, forming the second nanowire from the second active layer includes selectively removing a portion of the first active layer.

The method then includes forming a first gate electrode stack to completely surround the discrete channel region of the first nanowire. A second gate electrode stack is formed to completely surround the discrete channel region of the second nanowire. Subsequent processing operations such as contact formation and back-end interconnect formation may then be performed.

In an alternative embodiment, structures similar to the above described nanowire structures are fabricated on bulk wafers instead of silicon-on-insulator wafers. For example, FIG. 4 illustrates a three-dimensional cross-sectional view of another CMOS nanowire-based semiconductor structure, in accordance with an embodiment of the present invention.

Figure 4:
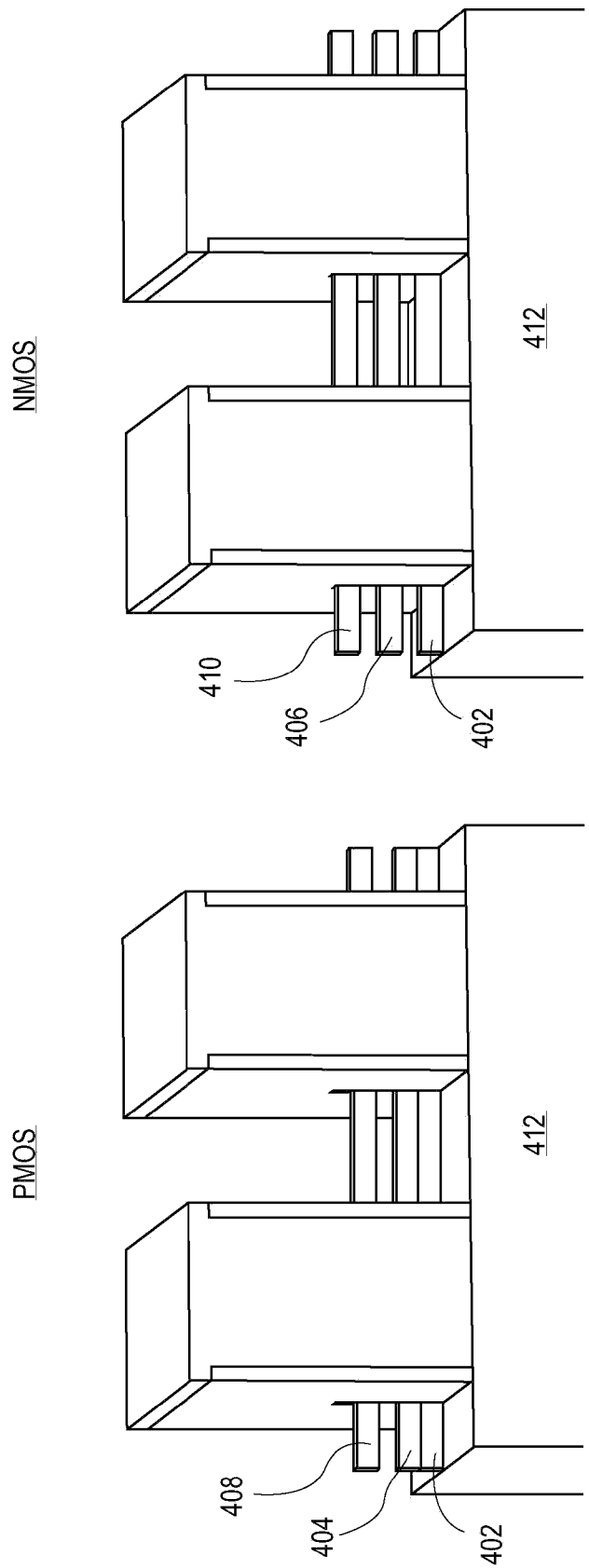
FIG. 4 illustrates a three-dimensional cross-sectional view of another CMOS nanowire-based semiconductor structure, in accordance with an embodiment of the present invention.

Referring to FIG. 4 a bulk substrate 412, such as a bulk silicon substrate, is partially patterned into a fin 402 and is used to provide a template for silicon germanium layers 404 and 408 (PMOS) or is included along with silicon layers 406 and 410 (NMOS). The substrate 412 on which fin 402 is isolated from the wires using either doping (e.g., such that the bottom wire is an omega-FET) or a post under fin oxidation process following fin patterning. No intervening global dielectric layer is disposed between the first active layer and the buffer layer of the bulk substrate. In a specific embodiment, both silicon nanowires and silicon germanium nanowires are fabricated, e.g. in a staggered fashion as depicted in FIG. 4.

Figure 5A:
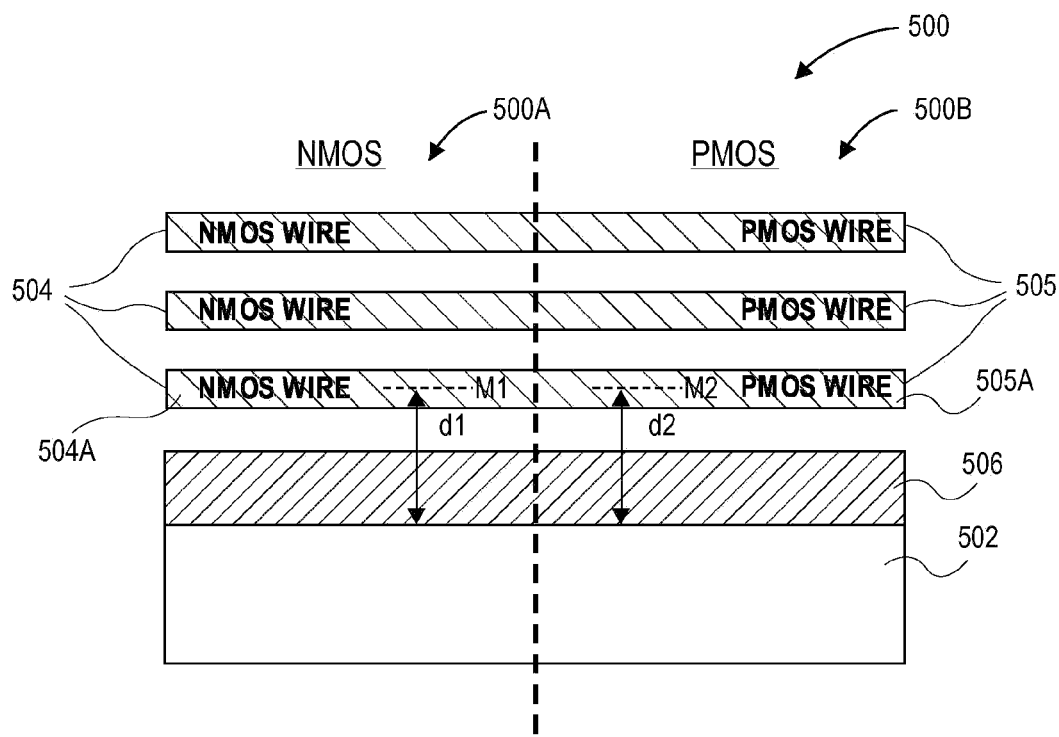
FIGS. 5A and 5B illustrate cross-sectional views representing various operations in a method of fabricating another CMOS nanowire semiconductor structure, in accordance with another embodiment of the present invention.
Figure 5B:
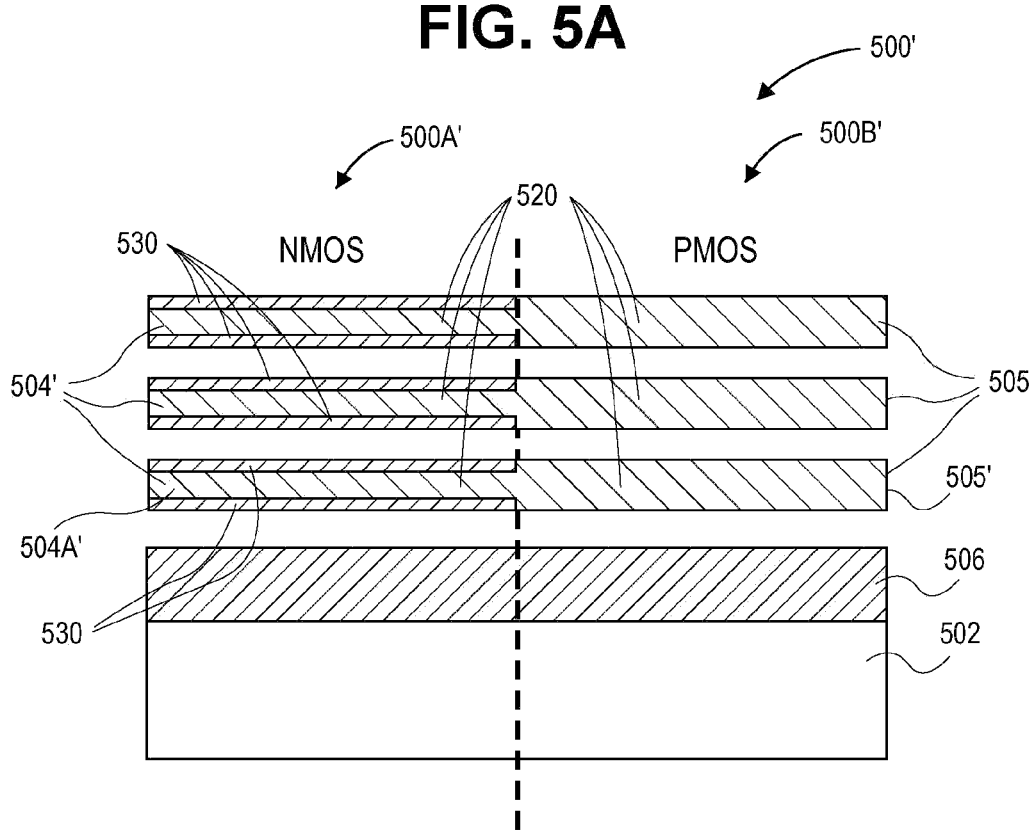

In a second aspect, in contrast to the above described embodiments, corresponding NMOS and PMOS nanowires of a CMOS structure are formed from a same semiconductor layer. For example, FIGS. 5A and 5B illustrate cross-sectional views representing various operations in a method of fabricating another CMOS nanowire semiconductor structure, in accordance with another embodiment of the present invention. It is to be understood that starting structures and relevant processing parameters may be similar to or the same as those described in association with FIGS. 3A-3F.

Referring to FIG. 5A, a semiconductor structure 500 includes a first semiconductor region 500A. The first semiconductor region 500A includes a first nanowire (e.g., bottom nanowire 504A of nanowire stack 504) disposed above a substrate 502. The first nanowire 504A has a mid-point (M1) a first distance (d1) above the substrate 502. The semiconductor structure 500 also includes a second semiconductor region 500B. The second semiconductor region 500B includes a second nanowire (e.g., bottom nanowire 505A of nanowire stack 505) disposed above the substrate 502. The second nanowire 505A has a mid-point (M2) a second distance (d2) above the substrate 502.

Referring again to FIG. 5A, the first distance (d1) is the same as the second distance (d2). That is, the mid-points M1 and M2 of the regions 500A and 500B are aligned. As such, in an embodiment, when stacks of a plurality of wires (e.g., 504 and 505) are formed, the wires for each region 500A and 500B are aligned relative to one another, e.g., since each corresponding wire is formed from a same semiconductor layer. It is to be understood that the dashed line in FIG. 5A can represent a relatively small or quite large spacing distance of regions 500A and 500B on a common substrate 502. In an embodiment, an isolation layer 506, such as an oxide layer, isolates the nanowires 504 and 505 from the substrate 502, as depicted in FIG. 5A.

The structure of FIG. 5A may be viewed as a back-bone structure. As described below in association with FIG. 5B, the back-bone structure may be used to tune the channel materials by growth of epitaxial cladding layers around portions of the back-bone structure. The addition of cladding epitaxial layers may provide a mobility benefit. After the sacrificial layers are removed to form the structure of FIG. 5A, an epitaxial cladding layer is grown on NMOS, or PMOS, or on both sides. In order to widen the gap between wires and reserve enough space for cladding epi, gate dielectric and gate metals, the backbone wires may be thinned by wet etching, dry etching, oxidation, or hydrogen anneal, as described in association with FIG. 6 below.

Thus, referring to FIG. 5B, a semiconductor structure 500' includes a first semiconductor device 500A'. The first semiconductor device 500A' includes a first nanowire (e.g., bottom nanowire 504A' of nanowire stack 504') disposed above the substrate 502. The first nanowire 504A' has a discrete channel region composed of a semiconductor backbone material 520. The semiconductor structure 500' also includes a second semiconductor device 500B'. The second semiconductor device 500B' includes a second nanowire (e.g., bottom nanowire 505A' of nanowire stack 505') disposed above the substrate 502. The second nanowire 505A' has a discrete channel region composed of the semiconductor backbone material 520.

However, the discrete channel region of the first nanowire 504A' also includes a cladding material layer 530 not included in the discrete channel region of the second semiconductor device 500B'. A first gate electrode stack (not shown) can be formed to completely surround the first nanowire 504A', including surrounding cladding layer 520. That is, once the gate stack is included, first nanowire 504A' has a discrete channel region and source and drain regions on either side of the discrete channel region. A second gate electrode stack (not shown) can be formed to completely surround the second nanowire 505A'. That is, once the second gate stack is included, second nanowire 505A' has a discrete channel region and source and drain regions on either side of the discrete channel region. As such, the structure of FIG. 5B may be used for CMOS device fabrication. In one embodiment, the first nanowire is used for NMOS device fabrication and the second nanowire is used for PMOS device fabrication. In another embodiment, the first nanowire is used for PMOS device fabrication and the second nanowire is used for NMOS device fabrication.

In an embodiment (not shown), the second nanowire further includes a surrounding cladding material layer different from the cladding material layer of the first nanowire. In one such embodiment, the first nanowire is used for NMOS device fabrication and the second nanowire is used for PMOS device fabrication. In another such embodiment, the first nanowire is used for PMOS device fabrication and the second nanowire is used for NMOS device fabrication. In an embodiment, the second nanowire does not include a surrounding cladding material layer, as depicted in FIG. 5B. In one such embodiment, the first nanowire is used for NMOS device fabrication and the second nanowire is used for PMOS device fabrication. In another such embodiment, the first nanowire is used for PMOS device fabrication and the second nanowire is used for NMOS device fabrication. Thus, devices may be fabricated with a common backbone but different overall semiconductor composition.

In an embodiment, the semiconductor backbone material of the first and second nanowires is formed from the same layer, e.g., the layers are not staggered from one another, as depicted in FIGS. 5A and 5B. In an embodiment, the semiconductor backbone material of the first nanowire has a smaller diameter than the semiconductor backbone material of the first nanowire, e.g., the first nanowires are thinned prior to cladding layer formation. In such an embodiment, the midpoints of corresponding NMOS/PMOS nanowires may be aligned but the wires have differing diameter from one another.

In an embodiment, the semiconductor backbone material is one such as, but not limited to, silicon, strained silicon, silicon germanium ($Si_xGe_y$, where $0<x<100$, and $0<y<100$), silicon carbide, carbon doped silicon germanium or a group III-V compound. In that embodiment, the cladding material layer is composed of a different material such as, but not limited to, silicon, strained silicon, silicon germanium ($Si_xGe_y$, where $0<x<100$, and $0<y<100$), silicon carbide, carbon doped silicon germanium or a group III-V compound.

Although replacement gate processes are described in some embodiments above, in another embodiment, devices are formed wherein the first gate structure formed is the permanent gate structure. Also, although a single cladding layer per wire is described for some embodiments above, more than one cladding layer may be used, e.g., as a stack of cladding layers, for a single nanowire.

A variety of approaches may be used to provide a cladding material layer on one or more nanowires during device fabrication. For example, FIG. 6 illustrates cross-sectional views illustrating several approaches to forming a cladding layer on a nanowire in the fabrication of a CMOS nanowire structure, in accordance with an embodiment of the present invention.

Figure 6:
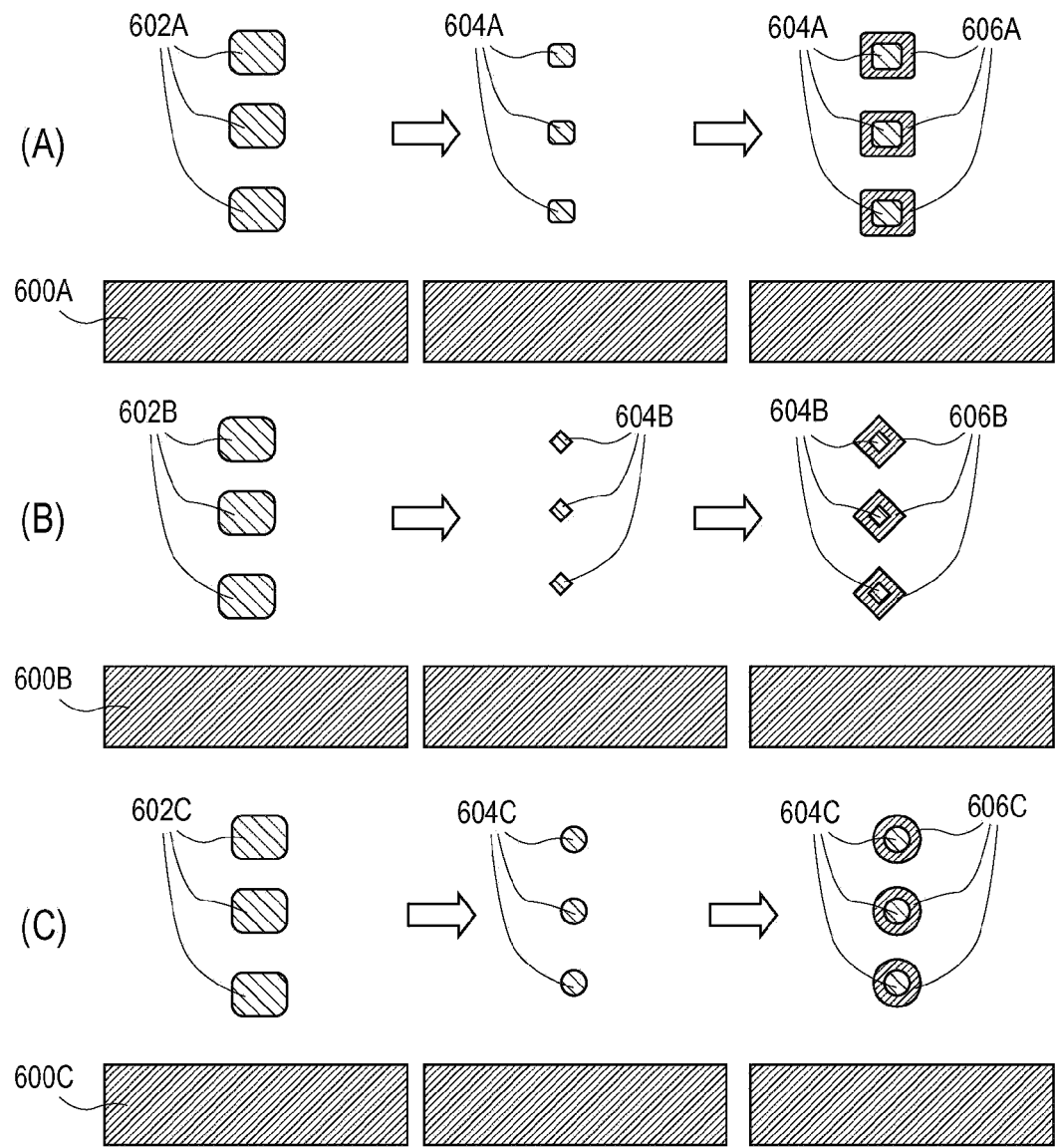
FIG. 6 illustrates cross-sectional views illustrating several approaches to forming a cladding layer on a nanowire in the fabrication of a CMOS nanowire structure, in accordance with an embodiment of the present invention.

Referring to process A of FIG. 6, backbone shape and size engineering prior to cladding layer formation on a plurality of nanowires includes starting, in a first operation, with a plurality of discrete nanowires 602A disposed above a substrate 600A. In a second operation, an isotropic etch (e.g., an isotropic wet or dry etch selective for the material of nanowires 602A) is employed to provide nanowires 604A with reduced dimension but approximately the same shape as compared with nanowires 602A, e.g., square or rectangular with rounded corners. In a third operation, a cladding material layer 606A (e.g., a layer composed of a semiconductor material different from the semiconductor material of nanowires 602A) is formed conformal with the nanowires 604A, e.g., by an epitaxial growth process.

Referring to process B of FIG. 6, backbone shape and size engineering prior to cladding layer formation on a plurality of nanowires includes starting, in a first operation, with a plurality of discrete nanowires 602B disposed above a substrate 600B. In a second operation, an etch preferring specific facet orientation (e.g., a wet or dry etch selective for, and preferring specific facet orientation for, the material of nanowires 602B) is employed to provide nanowires 604B with reduced dimension and a different shape as compared with nanowires 602B, e.g., diamond shaped. In a third operation, a cladding material layer 606B (e.g., a layer composed of a semiconductor material different from the semiconductor material of nanowires 602B) is formed conformal with the nanowires 604B, e.g., by an epitaxial growth process.

Referring to process C of FIG. 6, backbone shape and size engineering prior to cladding layer formation on a plurality of nanowires includes starting, in a first operation, with a plurality of discrete nanowires 602C disposed above a substrate 600C. In a second operation, an isotropic etch with oxidation/hydrogen annealing (e.g., an isotropic wet or dry etch selective for the material of nanowires 602C followed by oxidation/hydrogen annealing) is employed to provide nanowires 604C with reduced dimension and a different shape as compared with nanowires 602C, e.g., circular. In a third operation, a cladding material layer 606C (e.g., a layer composed of a semiconductor material different from the semiconductor material of nanowires 602C) is formed conformal with the nanowires 604C, e.g., by an epitaxial growth process.

Thus, referring to process flows A, B and C of FIG. 6, backbone shape engineering may be performed for epitaxial growth. The cross-sectional shape and crystal direction of backbone material may be engineered to improve epitaxial quality mobility as well as enabling improved gap fill. Backbone shape engineering may involve using different methods such as isotropic etch, etch preferring specific facet orientation, or isotropic etch with oxidation/hydrogen annealing.

As mentioned briefly throughout, one or more embodiments of the present invention include compressive strain for improved hole mobility for PMOS nanowire-based devices and tensile strain for improved electron mobility for NMOS nanowire-based devices. In an embodiment, strained silicon and strained silicon germanium devices are formed from such layers in order to improve or maximize device performance. In an embodiment, NMOS and PMOS uniaxially strained nanowire or nanoribbon devices are fabricated on or above a common substrate by one or more approaches described above. The PMOS transistors may include SiGe having uniaxial compressive strain along the current flow direction, while the NMOS transistors may include silicon having uniaxial tensile strain along the current flow direction.

Figure 7:
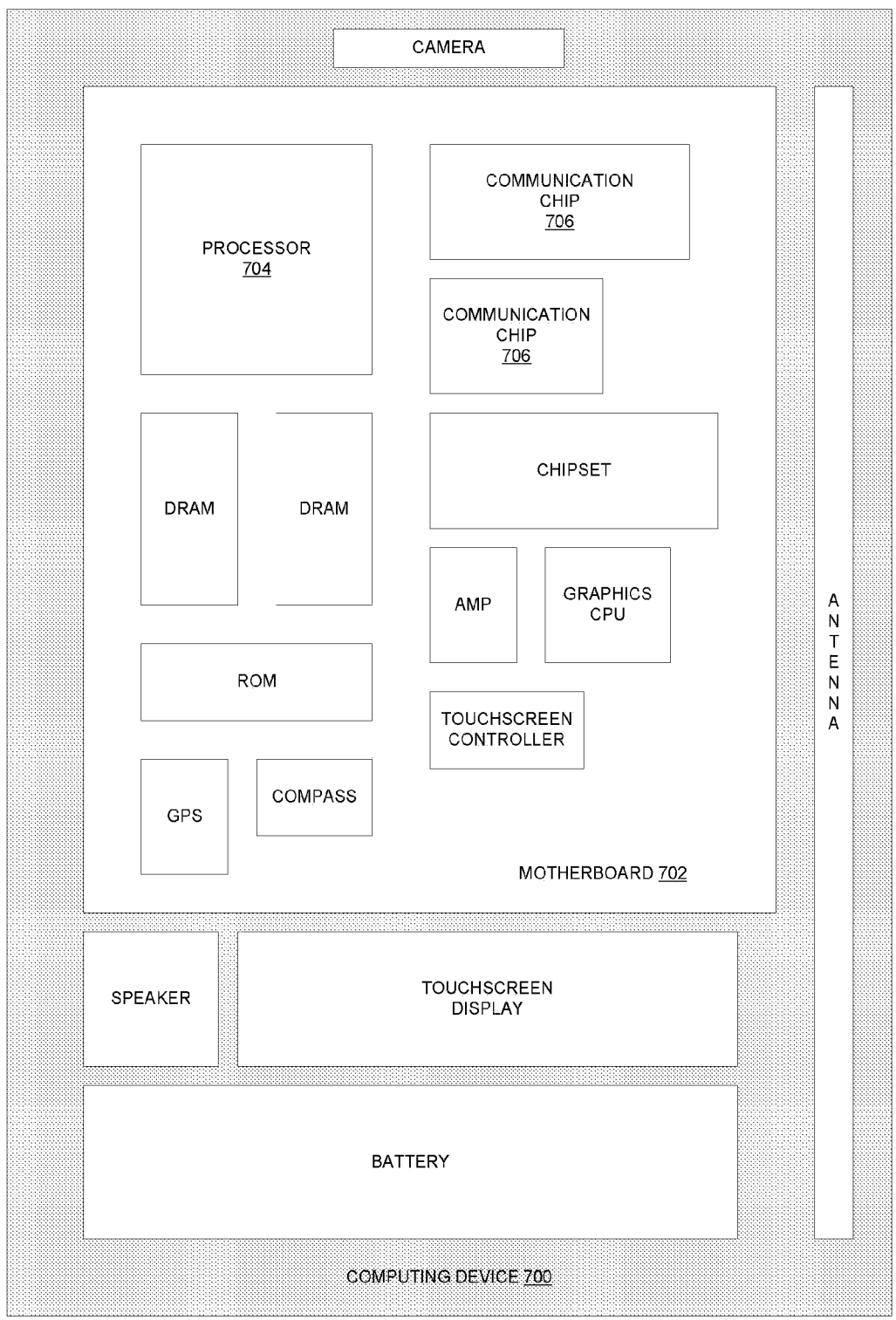
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, CMOS nanowire structures have been disclosed. In an embodiment, a semiconductor structure includes a first semiconductor device. The first semiconductor device includes a first nanowire disposed above a substrate. The first nanowire has a mid-point a first distance above the substrate and includes a discrete channel region and source and drain regions on either side of the discrete channel region. A first gate electrode stack completely surrounds the discrete channel region of the first nanowire. The semiconductor structure also includes a second semiconductor device. The second semiconductor device includes a second nanowire disposed above the substrate. The second nanowire has a mid-point a second distance above the substrate and includes a discrete channel region and source and drain regions on either side of the discrete channel region. The first distance is different from the second distance. A second gate electrode stack completely surrounds the discrete channel region of the second nanowire. In one such embodiment, the first nanowire is composed of a material such as, but not limited to, silicon, strained silicon, silicon germanium ($Si_xGe_y$, where 0<x<100, and 0<y<100), silicon carbide, carbon doped silicon germanium or a group III-V compound, and the second nanowire is composed of a different material such as, but not limited to, silicon, strained silicon, silicon germanium ($Si_xGe_y$, where 0<x<100, and 0<y<100), carbon doped silicon germanium or a group III-V compound.

What is claimed is:
1. A semiconductor structure, comprising:
a first semiconductor device comprising:
a first nanowire disposed above a substrate, the first nanowire having a mid-point a first distance above the substrate without an intervening nanowire between the first nanowire and the substrate, and the first nanowire comprising a discrete channel region and discrete source and drain regions on either side of the discrete channel region, wherein a portion of the first nanowire is non-discrete;
a first gate electrode stack completely surrounding the discrete channel region of the first nanowire;
a first pair of contacts completely surrounding the discrete source and drain regions of the first nanowire; and
a first pair of spacers disposed between the first gate electrode stack and the first pair of contacts; and
a second semiconductor device laterally adjacent to the first semiconductor device, the second semiconductor device comprising:
a second nanowire disposed above the substrate without an intervening nanowire between the second nanowire and the substrate, the second nanowire having a mid-point a second distance above the substrate, and the second nanowire comprising a discrete channel region and discrete source and drain regions on either side of the discrete channel region, wherein the first distance is different from the second distance, wherein a portion of the second nanowire is non-discrete;
a second gate electrode stack completely surrounding the discrete channel region of the second nanowire;
a second pair of contacts completely surrounding the discrete source and drain regions of the second nanowire; and
a second pair of spacers disposed between the second gate electrode stack and the second pair of contacts.

2. The semiconductor structure of claim 1, wherein the first nanowire consists essentially of a material selected from the group consisting of silicon, strained silicon, silicon germanium ($Si_xGe_y$, where 0<x<100, and 0<y<100), silicon carbide, carbon doped silicon germanium and a group III-V compound, and wherein the second nanowire consists essentially of a different material selected from the group consisting of silicon, strained silicon, silicon germanium ($Si_xGe_y$, where 0<x<100, and 0<y<100), carbon doped silicon germanium and a group III-V compound.

3. The semiconductor structure of claim 2, wherein the first semiconductor device is an NMOS device, and the second semiconductor device is a PMOS device.

4. The semiconductor structure of claim 1, wherein the first and second nanowires are disposed above a bulk crystalline substrate having an intervening dielectric layer disposed thereon.

5. The semiconductor structure of claim 1, wherein the first and second nanowires are disposed above a bulk crystalline substrate having no intervening dielectric layer disposed thereon.

6. A method of fabricating a semiconductor structure, the method comprising:
forming a first semiconductor device comprising a first nanowire formed above a substrate, the first nanowire having a mid-point a first distance above the substrate without an intervening nanowire between the first nanowire and the substrate, and the first nanowire comprising a discrete channel region and discrete source and drain regions on either side of the discrete channel region, and comprising a first gate electrode stack completely surrounding the discrete channel region of the first nanowire, and comprising a first pair of contacts completely surrounding the discrete source and drain regions of the first nanowire, wherein a portion of the first nanowire is non-discrete;
forming a first pair of spacers between the first gate electrode stack and the first pair of contacts;
forming a second semiconductor device laterally adjacent to the first semiconductor device, the second semiconductor device comprising a second nanowire formed above the substrate without an intervening nanowire between the second nanowire and the substrate, the second nanowire having a mid-point a second distance above the substrate, and the second nanowire comprising a discrete channel region and discrete source and drain regions on either side of the discrete channel region, wherein the first distance is different from the second distance, and comprising a second gate electrode stack completely surrounding the discrete channel region of the second nanowire, and comprising a second pair of contacts completely surrounding the discrete source and drain regions of the second nanowire, wherein a portion of the second nanowire is non-discrete; and
forming a second pair of spacers between the second gate electrode stack and the second pair of contacts.

7. The method of claim 6, wherein the first nanowire consists essentially of a material selected from the group consisting of silicon, strained silicon, silicon germanium ($Si_xGe_y$, where 0<x<100, and 0<y<100), silicon carbide, carbon doped silicon germanium and a group III-V compound, and wherein the second nanowire consists essentially of a different material selected from the group consisting of silicon, strained silicon, silicon germanium ($Si_xGe_y$, where 0<x<100, and 0<y<100), carbon doped silicon germanium and a group III-V compound.

8. The method of claim 6, wherein the first semiconductor device is an NMOS device, and the second semiconductor device is a PMOS device.

9. The method of claim 6, wherein the first and second nanowires are formed above a bulk crystalline substrate having an intervening dielectric layer formed thereon.

10. The method of claim 6, wherein the first and second nanowires are formed above a bulk crystalline substrate having no intervening dielectric layer formed thereon.

11. A semiconductor structure, comprising:
a first semiconductor device comprising:
  a first nanowire disposed above a substrate, the first nanowire having a mid-point a first distance above the substrate without an intervening nanowire between the first nanowire and the substrate, and the first nanowire comprising a discrete channel region and discrete source and drain regions on either side of the discrete channel region, wherein a portion of the first nanowire is non-discrete;
  a first gate electrode stack completely surrounding the discrete channel region of the first nanowire;
  a first pair of contacts completely surrounding the discrete source and drain regions of the first nanowire; and
a second semiconductor device laterally adjacent to the first semiconductor device, the second semiconductor device comprising:
  a second nanowire disposed above the substrate without an intervening nanowire between the second nanowire and the substrate, the second nanowire having a mid-point a second distance above the substrate, and the second nanowire comprising a discrete channel region and discrete source and drain regions on either side of the discrete channel region, wherein the first distance is different from the second distance, wherein a portion of the second nanowire is non-discrete;
  a second gate electrode stack completely surrounding the discrete channel region of the second nanowire; and
  a second pair of contacts completely surrounding the discrete source and drain regions of the second nanowire.

12. The semiconductor structure of claim 11, wherein the first nanowire consists essentially of a material selected from the group consisting of silicon, strained silicon, silicon germanium ($Si_xGe_y$, where 0<x<100, and 0<y<100), silicon carbide, carbon doped silicon germanium and a group III-V compound, and wherein the second nanowire consists essentially of a different material selected from the group consisting of silicon, strained silicon, silicon germanium ($Si_xGe_y$, where 0<x<100, and 0<y<100), carbon doped silicon germanium and a group III-V compound.

13. The semiconductor structure of claim 12, wherein the first semiconductor device is an NMOS device, and the second semiconductor device is a PMOS device.

14. The semiconductor structure of claim 11, wherein the first and second nanowires are disposed above a bulk crystalline substrate having an intervening dielectric layer disposed thereon.

15. The semiconductor structure of claim 11, wherein the first and second nanowires are disposed above a bulk crystalline substrate having no intervening dielectric layer disposed thereon.

* * * * *